(12) United States Patent
Choi et al.

(10) Patent No.: US 11,551,733 B2
(45) Date of Patent: Jan. 10, 2023

(54) DATA STROBE CLOCK OUTPUT CIRCUIT

(71) Applicant: SK hynix Inc., Icheon-si (KR)

(72) Inventors: Eun Ji Choi, Icheon-si (KR); Ja Yoon Goo, Icheon-si (KR); Sung Hwa Ok, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 209 days.

(21) Appl. No.: 17/089,450

(22) Filed: Nov. 4, 2020

(65) Prior Publication Data
US 2022/0005513 A1 Jan. 6, 2022

(30) Foreign Application Priority Data

Jul. 2, 2020 (KR) .......................... 10-2020-0081582

(51) Int. Cl.
*G11C 7/22* (2006.01)
*H03K 19/20* (2006.01)

(52) U.S. Cl.
CPC .............. *G11C 7/222* (2013.01); *H03K 19/20* (2013.01)

(58) Field of Classification Search
CPC . H03K 19/20; G06F 13/4243; G06F 13/1689; G11C 7/222; G11C 8/18; G11C 7/06; G11C 7/1051; G11C 2207/2254

USPC ......................................................... 365/193
See application file for complete search history.

(56) References Cited

U.S. PATENT DOCUMENTS

| 10,998,061 | B1 * | 5/2021 | Tsai | ...................... G11C 16/32 |
| 2019/0361820 | A1 * | 11/2019 | Ware | ...................... G11C 7/222 |
| 2021/0006254 | A1 * | 1/2021 | Kim | .......................... H03L 7/18 |
| 2021/0081204 | A1 * | 3/2021 | Jeon | .......................... G06F 1/12 |

FOREIGN PATENT DOCUMENTS

| KR | 1020140062338 A | 5/2014 |
| KR | 1020170068690 A | 6/2017 |

\* cited by examiner

*Primary Examiner* — Fernando Hidalgo
(74) *Attorney, Agent, or Firm* — William Park & Associates Ltd.

(57) ABSTRACT

The present technology includes a data strobe clock output circuit. The data strobe clock output circuit includes a first output circuit configured to generate a rising clock and a falling clock in response to a clock and a first enable signal and output a first data strobe clock in response to the rising clock, the falling clock, and mode signals, and a second output circuit configured to generate a rising inverted clock and a falling inverted clock by inverting the rising clock and the falling clock generated by the first output circuit, and output a second data strobe clock in response to the rising inverted clock, the falling inverted clock, a second enable signal, and the mode signals.

20 Claims, 10 Drawing Sheets

DATA STROBE CLOCK OUTPUT CIRCUIT

CROSS-REFERENCE TO RELATED APPLICATION

The present application claims priority under 35 U.S.C. § 119(a) to Korean patent application number 10-2020-0081582 filed on Jul. 2, 2020, in the Korean Intellectual Property Office, the entire disclosure of which is incorporated by reference herein.

BACKGROUND

1. Technical Field

The present disclosure relates to a data strobe clock output circuit, and more particularly, to a data strobe clock output circuit included in a controller that controls a memory device.

2. Related Art

A memory system may include a memory device capable of storing data and a controller capable of controlling the memory device.

The memory device may be configured as a volatile memory device in which stored data is lost when power supply is cut off, or a non-volatile memory device in which stored data is maintained even though the power supply is cut off.

The controller may generate a command for controlling the memory device according to a request of a host, and map an address between the host and the memory device.

The controller and the memory device may communicate through a channel. The channel may include control lines, input and output lines, and data strobe clock lines. The control lines may transmit various signals for the controller to determine a mode of the memory device or select a chip. For example, the control lines may transmit signals such as a chip enable signal and a read enable signal. The input and output lines may transmit a command, data, or an address, and the data strobe clock lines may transmit data strobe clocks. The data transmitted between the controller and the memory device may be latched to the controller or memory device according to the data strobe clocks.

SUMMARY

A data strobe clock output circuit according to an embodiment of the present disclosure may include a first output circuit configured to generate a rising clock and a falling clock in response to a clock and a first enable signal and output a first data strobe clock in response to the rising clock, the falling clock, and mode signals, and a second output circuit configured to generate a rising inverted clock and a falling inverted clock by inverting the rising clock and the falling clock generated by the first output circuit, and output a second data strobe clock in response to the rising inverted clock, the falling inverted clock, a second enable signal, and the mode signals.

A data strobe clock output circuit according to an embodiment of the present disclosure may include a clock modulator configured to output a modulated clock and a modulated inverted clock in response to a clock, an inverted clock, and a first enable signal, a trigger circuit configured to output a rising clock and a falling clock in response to the clock, the modulated clock, and the modulated inverted clock; an enable selector configured to output sub mode signals in response to mode signals and a second enable signal, a first mode selector configured to output pull-up clocks and pull-down clocks in response to the rising clock, the falling clock, and the mode signals, a first driver configured to output a first data strobe clock in response to one or more of the pull-up clocks and one or more of the pull-down clocks, a second mode selector configured to invert the rising clock to generate the rising inverted clock, invert the falling clock to generate the falling inverted clock, and output pull-up clocks and pull-down clocks in response to the rising inverted clock, the falling inverted clock, and the sub mode signals, and a second driver configured to output a second data strobe clock in response to one or more of the pull-up clocks and one or more of the pull-down clocks.

DETAILED DESCRIPTION

Figure 1:
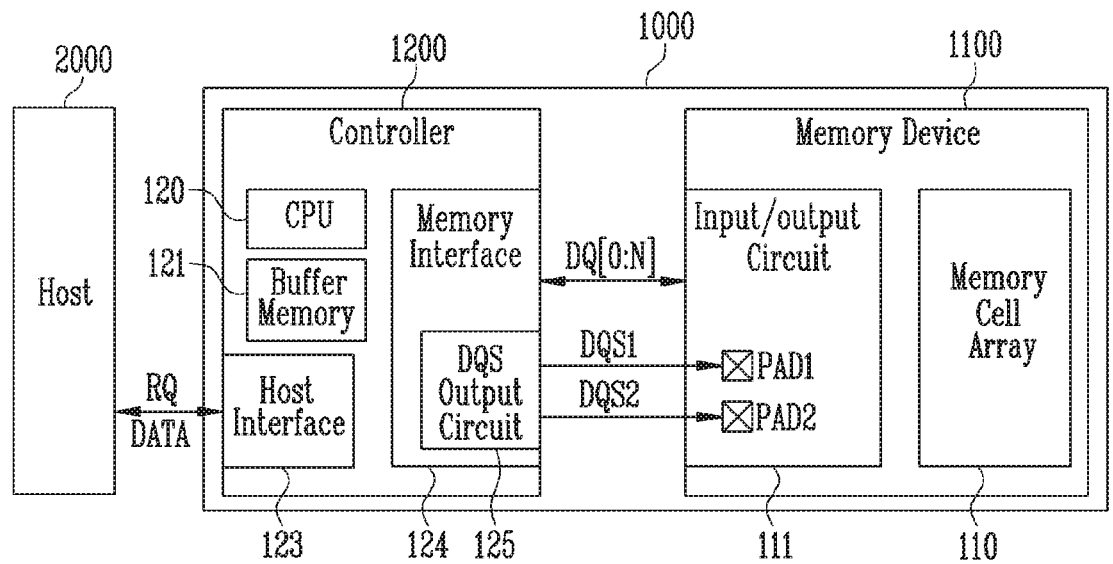
FIG. 1 is a diagram for describing a memory system according to an embodiment of the present disclosure.

FIG. 1 is a diagram for describing a memory system according to an embodiment of the present disclosure.

Referring to FIG. 1, the memory system 1000 may store, output, or erase data according to a request RQ of a host 2000. For example, the host 2000 may transmit data DATA to the memory system 1000 together with the request RQ for a program, and the memory system 1000 may store the data DATA according to the request RQ.

The memory system 1000 may include a memory device 1100 capable of storing data and a controller 1200 capable of controlling the memory device 1100.

The memory device 1100 may include a memory cell array 110 and an input/output circuit 111. The memory cell array 110 may include a plurality of memory cells. The input/output circuit 111 may receive a command, an address, and data from the controller 1200 or output data through input/output lines DQ[0:N] in response to first and second data strobe clocks DQS1 and DQS2 input to first and second pads PAD1 and PAD2. In addition to the memory cell array 110 and the input/output circuit 111, the memory device 1100 shown in FIG. 1 may include peripheral circuits (not shown) configured to perform program, read, or erase operations.

The controller 1200 may include a central processing unit 120, a buffer memory 121, a host interface 123, and a memory interface 124. The central processing unit 120 may generally control an operation of the memory system 1000 according to the request RQ of the host 2000. The buffer memory 121 may store system data necessary for an operation of the controller 1200. For example, the buffer memory 121 may store system data such as address mapping information. The host interface 123 may exchange the request (RQ), an address, and the data DATA between the controller 1200 and the host 2000. For example, the host interface 123 may include various interfaces such as peripheral component interconnect express (PCIe), advanced technology attachment (ATA), serial ATA (SATA), parallel ATA (PATA), serial attached SCSI (SAS), non-volatile memory express (NVMe), universal serial bus (USB), multi-media card (MMC), enhanced small disk interface (ESDI), or integrated drive electronics (IDE).

The memory interface 124 may exchange the command, the address, and the data between the controller 1200 and the memory device 1100 and output the first and second data strobe clocks DQS1 and DQS2. For example, the command, the address, and the data may be transmitted through the input/output lines DQ[0:N] connected between the controller 1200 and the memory device 1100, and the first and second data strobe clocks DQS1 and DQS2 may be output from the controller 1200 to the memory device 1100 through the data strobe lines. The memory interface 124 may include a data strobe clock output circuit (DQS output circuit) 125 configured to output the first and second data strobe clocks DQS1 and DQS2. For example, when the controller 1200 transmits the data to the memory device 1100, the memory interface 124 may load the data on the input/output lines DQ[0:N], and may output the first and second data strobe clocks DQS1 and DQS2. The memory device 1100 may receive the first data strobe clock DQS1 through the first pad PAD1 and may receive the second data strobe clock DQS2 through the second pad PAD2. The memory device 1100 may sequentially receive the data loaded on the input/output lines DQ[0:N] in response to the first and second data strobe clocks DQS1 and DQS2 received to the first and second pads PAD1 and PAD2. For example, the data strobe clock output circuit 125 may output the first and second data strobe clocks DQS1 and DQS2 having phases opposite to each other. For example, when the first data strobe clock DQS1 is high, the second data strobe clock DQS2 is low. The data loaded on the input/output lines DQ[0:N] may be input to the memory device 1100 when the first data strobe clock DQS1 transits from low to high, and may be input to the memory device 1100 when the second data strobe clock DQS2 transits from high to low. The data strobe clock output circuit 125 may simultaneously output the first and second data strobe clocks DQS1 and DQS2, but may also output only the first data strobe clock DQS1. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The above-described data strobe clock output circuit 125 is described, for example, as follows.

Figure 2:
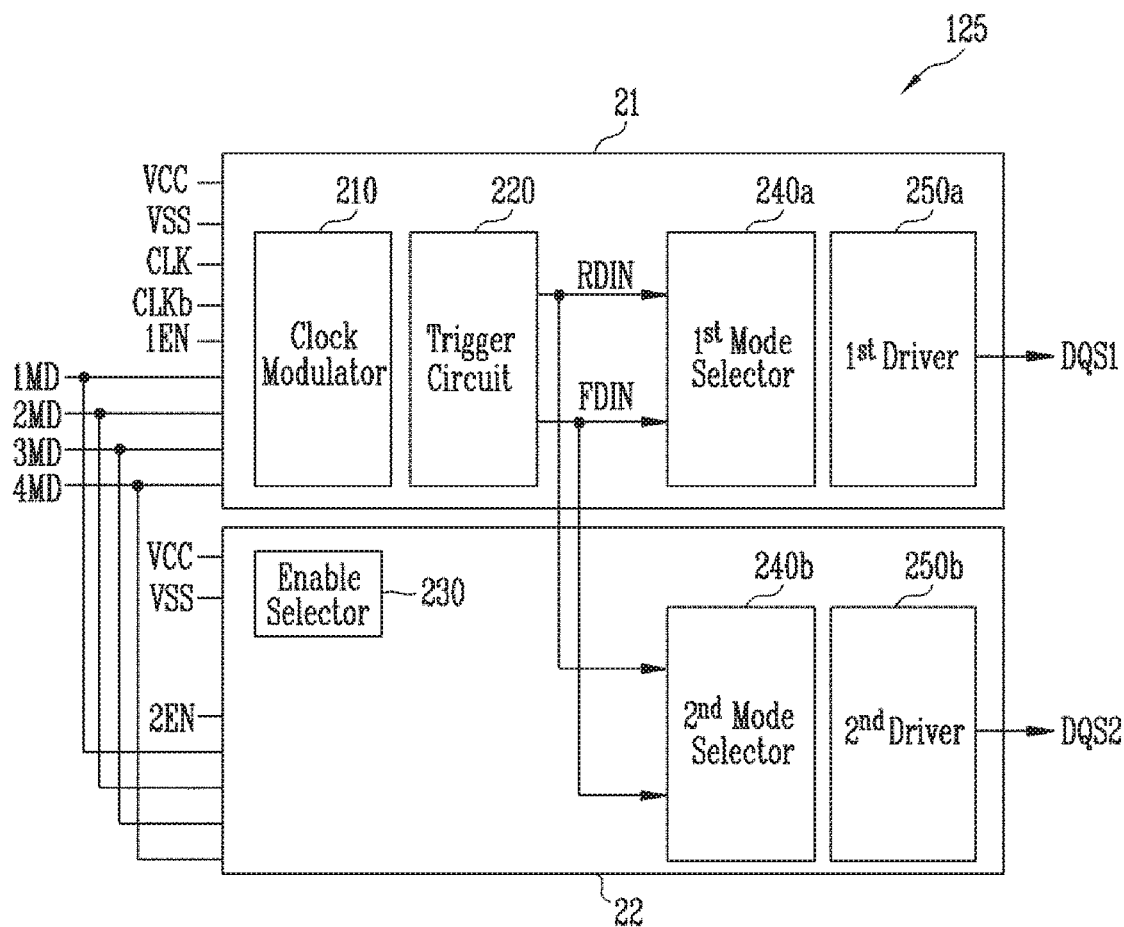
FIG. 2 is a diagram for describing a data strobe clock output circuit according to an embodiment of the present disclosure.

FIG. 2 is a diagram for describing a data strobe clock output circuit according to an embodiment of the present disclosure.

Referring to FIG. 2, the data strobe clock output circuit 125 may include a first output circuit 21 capable of outputting the first data strobe clock DQS1 and a second output circuit 22 capable of outputting the second data strobe clock DQS2. According to an embodiment, a size of the second output circuit 22 may be reduced by sharing some circuits included in the first output circuit 21.

The first output circuit 21 may receive a power voltage VCC and a ground voltage VSS, and output the first data strobe clock DQS1 in response to a clock CLK, an inverted clock CLKb, a first enable signal 1EN, and first to fourth mode signals 1MD to 4MD.

The first output circuit 21 may include a clock modulator 210, a trigger circuit 220, a first mode selector 240a, and a first driver 250a. The clock modulator 210 may receive the power voltage VCC and the ground voltage VSS, and output a modulated clock and a modulated inverted clock in response to the clock CLK, the inverted clock CLKb, and the first enable signal 1EN. The trigger circuit 220 may output a rising clock RDIN and a falling clock FDIN in response to the clock CLK, the inverted clock CLKb, the modulated clock, and the modulated inverted clock. The first mode selector 240a may output one or more pull-up clocks and one or more pull-down clocks in response to the rising clock RDIN, the falling clock FDIN, and the first to fourth mode signals 1MD to 4MD. The first to fourth mode signals 1MD to 4MD may be signals that vary according to a mode for determining a pulse width of the first and second data strobe clocks DQS1 and DQS2. Although the first to fourth mode signals 1MD to 4MD are shown in the present embodiment, a greater number of mode signals may be used. The first driver 250a may output the first data strobe clock DQS1 in response to the pull-up clock and the pull-down clock received from the first mode selector 240a.

The second output circuit 22 may receive the power voltage VCC and the ground voltage VSS, and output the second data strobe clock DQS2 in response to a second enable signal 2EN and the first to fourth mode signals 1MD to 4MD.

The second output circuit 22 may include an enable selector 230, a second mode selector 240b, and a second driver 250b. The enable selector 230 may output first to fourth sub mode signals in response to the second enable signal 2EN and the first to fourth mode signals 1MD to 4MD. For example, when a high second enable signal 2EN is input to the enable selector 230, the second output circuit 22 may be activated and may output the second data strobe clock DQS2. That is, when the second enable signal 2EN is high or at a high level, the second output circuit 22 may output the second data strobe clock DQS2 when the first data strobe clock DQS1 is output from the first output circuit 21. When the second enable signal 2EN is low or at a low level, the second output circuit 22 may be deactivated and might not output the second data strobe clock DQS2.

Circuits included in each of the first and second output circuits 21 and 22 are described, for example, as follows.

Figure 3:
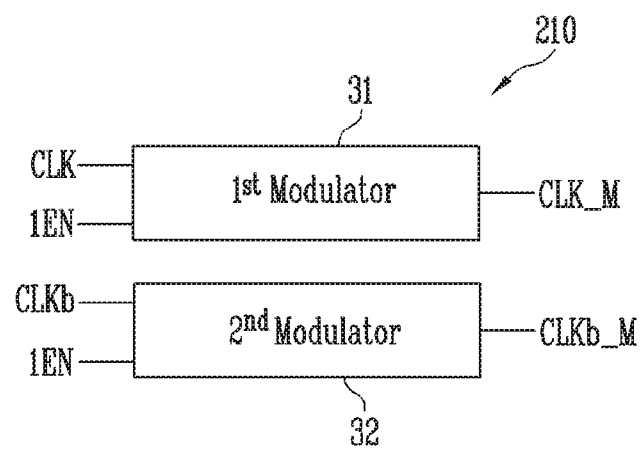
FIG. 3 is a diagram for describing a clock modulator according to an embodiment of the present disclosure.

FIG. 3 is a diagram for describing the clock modulator according to an embodiment of the present disclosure.

Referring to FIG. 3, the clock modulator 210 may be activated in response to the first enable signal 1EN, and modulate pulse widths of the clock CLK and the inverted clock CLKb to output a modulated clock CLK_M and a modulated inverted clock CLKb_M. The clock modulator 210 may include a first modulator 31 that modulates the clock CLK and a second modulator 32 that modulates the inverted clock CLKb.

A width of a high pulse of the modulated clock CLK_M may be narrower than a width of a high pulse of the clock CLK, and a width of a low pulse of the modulated clock CLK_M may be wider than a width of a low pulse of the clock CLK.

A width of a high pulse of the modulated inverted clock CLKb_M may be narrower than a width of a high pulse of the inverted clock CLKb, and a width of a low pulse of the modulated inverted clock CLKb_M may be wider than a width of a low pulse of the inverted clock CLKb.

Figure 4:
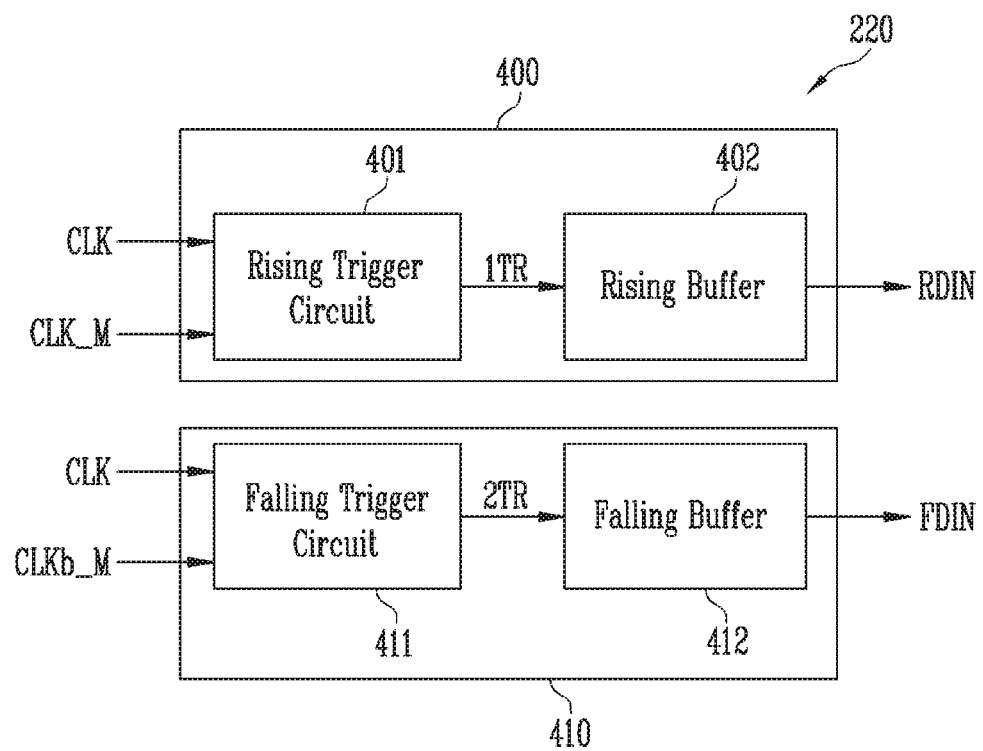
FIG. 4 is a diagram for describing a trigger circuit according to an embodiment of the present disclosure.

FIG. 4 is a diagram for describing the trigger circuit according to an embodiment of the present disclosure.

Referring to FIG. 4, the trigger circuit 220 may output the rising clock RDIN and the falling clock FDIN in response to the clock CLK, the modulated clock CLK_M, and the modulated inverted clock CLKb_M. The trigger circuit 220 may include a rising circuit 400 capable of outputting the rising clock RDIN, and a falling circuit 410 capable of outputting the falling clock FDIN.

The rising circuit 400 may include a rising trigger circuit 401 and a rising buffer 402.

The rising trigger circuit 401 may output a first trigger clock 1TR in response to the clock CLK and the modulated clock CLK_M.

The rising buffer 402 may output the rising clock RDIN in response to the first trigger clock 1TR.

The falling circuit 410 may include a falling trigger circuit 411 and a falling buffer 412. The falling trigger circuit 411 may be configured similarly to the rising trigger circuit 401, and the falling buffer 412 may be configured similarly to the rising buffer 402.

The falling trigger circuit 411 may output a second trigger clock 2TR in response to the clock CLK and the modulated inverted clock CLKb_M.

The falling buffer 412 may output the falling clock FDIN in response to a second trigger clock 2TR.

Figure 5:
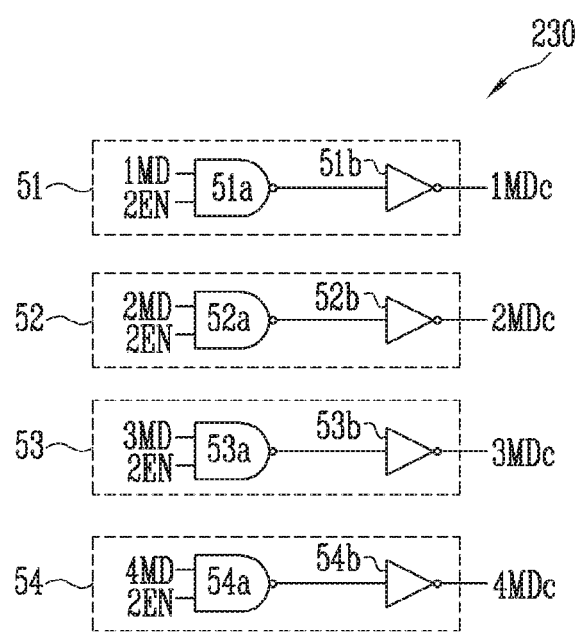
FIG. 5 is a diagram for describing an enable selector according to an embodiment of the present disclosure.

FIG. 5 is a diagram for describing the enable selector according to an embodiment of the present disclosure.

Referring to FIG. 5, the enable selector 230 may output first to fourth sub mode signals 1MDc to 4MDc in response to the second enable signal 2EN and the first to fourth mode signals 1MD to 4MD. For example, the enable selector 230 may include first to fourth enable circuits 51 to 54.

The first enable circuit 51 may include a NAND gate 51a that outputs a logic value in response to the first mode signal 1MD and the second enable signal 2EN, and an inverter 51b that inverts the logic value output from the NAND gate 51a to output the first sub mode signal 1MDc. The second to fourth enable circuits 52 to 54 may also include NAND gates 52a to 54a and enable circuits 52b to 54b, and may be configured identically to the first enable circuit 51. The second enable circuit 52 may output the second sub mode signal 2MDc in response to the second mode signal 2MD and the second enable signal 2EN, the third enable circuit 53 may output the third sub mode signal 3MDc in response to the third mode signal 3MD and the second enable signal 2EN, and the fourth enable circuit 54 may output the fourth sub mode signal 4MDc in response to the fourth mode signal 4MD and the second enable signal 2EN.

The first to fourth mode signals 1MD to 4MD may be signals that vary according to the mode for determining the pulse width of the first and second data strobe clocks DQS1 and DQS2. Although the first to fourth mode signals 1MD to 4MD are shown in the present embodiment, a greater number of mode signals may be used.

Figure 6:
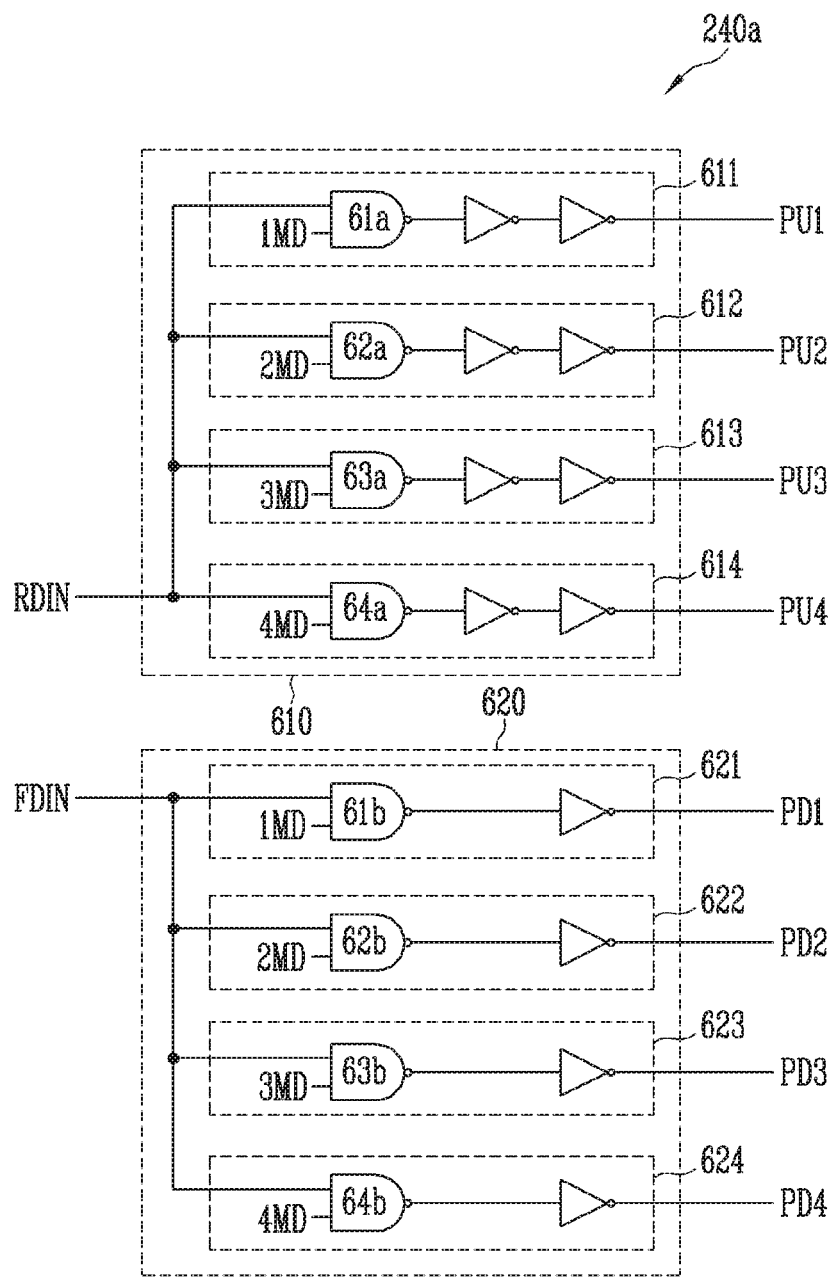
FIG. 6 is a diagram for describing a first mode selector according to an embodiment of the present disclosure.

FIG. 6 is a diagram for describing the first mode selector according to an embodiment of the present disclosure.

Referring to FIG. 6, the first mode selector 240a may output one or more pull-up clocks PU1 to PU4 and one or more pull-down clocks PD1 to PD4 in response to the rising clock RDIN, the falling clock FDIN, and the first to fourth mode signals 1MD to 4MD. For example, the first mode selector 240a may include a pull-up circuit 610 configured to output the pull-up clocks PU1 to PU4 and a pull-down circuit 620 configured to output the pull-down clocks PD1 to PD4.

The pull-up circuit 610 may include first to fourth sub pull-up circuits 611 to 614 outputting the first to fourth pull-up clocks PU1 to PU4. The first to fourth sub pull-up circuits 611 to 614 may commonly receive the rising clock RDIN, and receive the first to fourth mode signals 1MD to 4MD, respectively, to output the first to fourth pull-up clocks PU1 to PU4. The first sub pull-up circuit 611 may include a NAND gate 61a to which the rising clock RDIN is input to a first input terminal and the first mode signal 1MD is input to a second input terminal, and an even number of inverters outputting a logic value output from the NAND gate 61a as the first pull-up clock PUL. The remaining second to fourth sub pull-up circuits 612 to 614 may also be configured identically to the first sub pull-up circuit 611. For example, the second to fourth sub pull-up circuits 612 to 614 may include NAND gates 62a to 64a and inverters, and output the second to fourth pull-up clocks PU2 to PU4, respectively, in response to the rising clock RDIN and the second to fourth mode signals 2MD to 4MD input to the NAND gates 62a to 64a.

The pull-down circuit 620 may include first to fourth sub pull-down circuits 621 to 624 outputting the first to fourth pull-down clocks PD1 to PD4. The first to fourth sub pull-down circuits 621 to 624 may commonly receive the falling clock FDIN, and receive the first to fourth mode signals 1MD to 4MD, respectively, to output the first to fourth pull-down clocks. The first sub pull-down circuit 621 may include a NAND gate 61b to which the falling clock FDIN is input to a first input terminal and the first signal 1MD is input to a second input terminal, and an odd number of inverters or an inverter that inverts a logic value output from the NAND gate 61b and outputs the inverted logic value as the first pull-down clock PD1. The remaining second to fourth sub pull-down circuits 622 to 624 may be configured identically to the first sub pull-down circuit 621. For example, the second to fourth sub pull-down circuits 622 to 624 may include NAND gates 62b to 64b and inverters, and output the second to fourth pull-down clocks PD2 to PD4, respectively, in response to the falling clock FDIN and the second to fourth mode signals 2MD to 4MD input to the NAND gates 62b to 64b.

Figure 7:
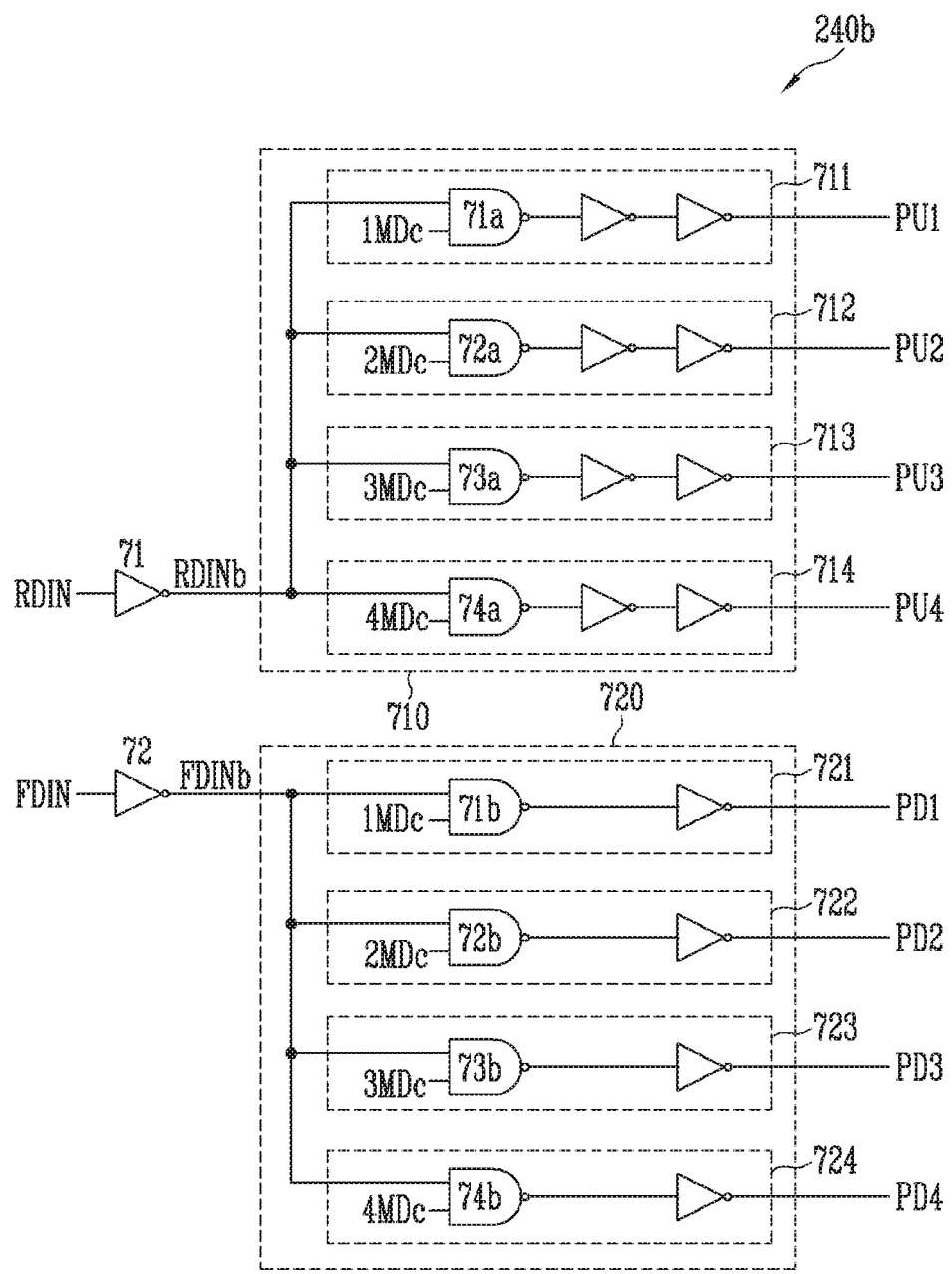
FIG. 7 is a diagram for describing a second mode selector according to an embodiment of the present disclosure.

FIG. 7 is a diagram for describing the second mode selector according to an embodiment of the present disclosure.

Referring to FIG. 7, the second mode selector 240b may output one or more pull-up clocks PU1 to PU4 and one or more pull-down clocks PD1 to PD4 in response to a rising inverted clock RDINb, a falling inverted clock FDINb, and the first to fourth sub mode signals 1MDc to 4MDc. For example, the second mode selector 240b may include a pull-up circuit 710 configured to output the pull-up clocks PU1 to PU4 and a pull-down circuit 720 configured to output the pull-down clocks PD1 to PD4. In an embodiment, an inverter 71 may receive a rising clock to output the rising inverted clock RDINb. In an embodiment, an inverter 72 may receive a falling clock FDIN to output the falling inverted clock FDINb.

The pull-up circuit 710 may include first to fourth sub pull-up circuits 711 to 714 outputting the first to fourth pull-up clocks PU1 to PU4. The first to fourth sub pull-up circuits 711 to 714 may commonly receive the rising inverted clock RDINb, and receive the first to fourth sub mode signals 1MDc to 4MDc, respectively, to output the first to fourth pull-up clocks PU1 to PU4. The first sub pull-up circuit 711 may include a NAND gate 71a to which the rising inverted clock RDINb is input to a first input terminal and the first sub mode signal 1MDc is input to a second input terminal, and an even number of inverters outputting a logic value output from the NAND gate 71a as the first pull-up clock PU1. The remaining second to fourth sub pull-up circuits 712 to 714 may be configured identically to the first sub pull-up circuit 711. For example, the second to fourth sub pull-up circuits 712 to 714 may include NAND gates 72a to 74a and inverters, and output the second to fourth pull-up clocks PU2 to PU4, respectively, in response to the rising inverted clock RDINb and the second to fourth sub-mode signals 2MDc to 4MDc input to the NAND gates 72a to 74a.

The pull-up circuit 710 of the second mode selector 240b may output the first to fourth pull-up clocks PU1 to PU4 having phases opposite to the phases of the first to fourth pull-up clocks PU1 to PU4 output from the pull-up circuit 610.

The pull-down circuit 720 may include first to fourth sub pull-down circuits 721 to 724 outputting the first to fourth pull-down clocks PD1 to PD4. The first to fourth sub pull-down circuits 721 to 724 may commonly receive the falling inverted clock FDINb, and receive the first to fourth sub mode signals 1MDc to 4MDc, respectively, to output the first to fourth pull-down clocks PD1 to PD4. The first sub pull-down circuit 721 may include a NAND gate 71b to which the falling inverted clock FDINb is input to a first input terminal and the first sub mode signal 1MDc is input to the second input terminal, and an odd number of inverters or an inverter that inverts a logic value output from the NAND gate 71b and outputs the inverted logic value as the first pull-down clock PD1. The remaining second to fourth sub pull-down circuits 722 to 724 may be configured identically to the first sub pull-down circuit 721. For example, the second to fourth sub pull-down circuits 722 to 724 may include NAND gates 72b to 74b and inverters, and output the second to fourth pull-down clocks PD2 to PD4, respectively, in response to the falling inverted clock FDINb and the second to fourth sub-mode signals 2MDc to 4MDc input to the NAND gates 72b to 74b.

Figure 8:
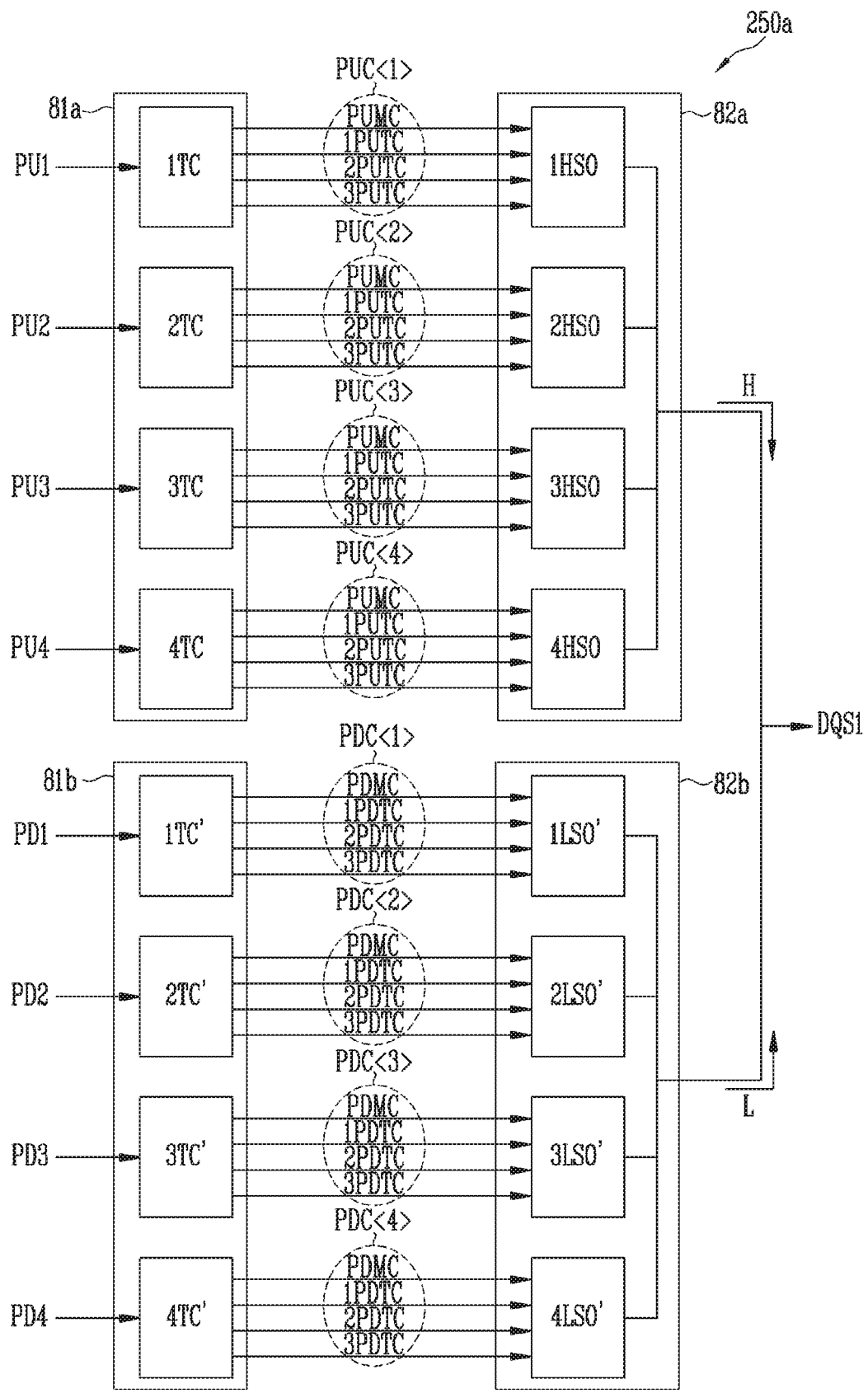
FIG. 8 is a diagram for describing a first driver according to an embodiment of the present disclosure.

FIG. 8 is a diagram for describing the first driver according to an embodiment of the present disclosure.

Referring to FIG. 8, the first driver 250a may output the first data strobe clock DQS1 in response to the first to fourth pull-up clocks PU1 to PU4 and the first to fourth pull-down clocks PD1 to PD4 output from the first mode selector 240a. The first driver 250a may include a first pull-up pre-driver 81a, a first pull-down pre-driver 81b, a first pull-up main driver 82a, and a first pull-down main driver 82b.

The first pull-up pre-driver 81a may output first to fourth pull-up codes PUC<1> to PUC<4> by trimming the first to fourth pull-up clocks PU1 to PU4. The first pull-up main driver 82a may output a high pulse H having a power voltage level in response to the first to fourth pull-up codes PUC<1> to PUC<4>.

The first pull-up pre-driver 81a may include first to fourth trimming circuits 1TC to 4TC outputting the first to fourth pull-up codes PUC<1> to PUC<4> by trimming the first to fourth pull-up clocks PU1 to PU4, respectively. The first pull-up main driver 82a may include first to fourth high pulse output circuits 1HSO to 4HSO outputting the high pulse H in response to the first to fourth pull-up codes PUC<1> to PUC<4>. The first to fourth trimming circuits 1TC to 4TC may be configured identically to each other, and the first to fourth high pulse output circuits 1HSO to 4HSO may be configured identically to each other. The first trimming circuit 1TC may output a pull-up main code PUMC and first to third pull-up trimming codes 1PUTC to 3PUTC by trimming the first pull-up clock PU1, and the first high pulse output circuit 1HSO may output the high pulse H in response to the pull-up main code PUMC and the first to third pull-up trimming codes 1PUTC to 3PUTC. The remaining second to fourth trimming circuits 2TC to 4TC may also output second to fourth pull-up codes PUC<2> to PUC<4> including the pull-up main code PUMC and the first to third pull-up trimming codes 1PUTC to 3PUTC by trimming the second to fourth pull-up clocks PU2 to PU4, respectively. The second to fourth high pulse output circuits 2HSO to 4HSO may output the high pulse H in response to the second to fourth pull-up codes PUC<2> to PUC<4>, respectively.

All of the first to fourth pull-up clocks PU1 to PU4 may be activated or only some of the first to fourth pull-up clocks PU1 to PU4 may be activated according to a mode, and only circuits connected to an activated pull-up clock among the first to fourth trimming circuits 1TC to 4TC and the first to fourth high pulse output circuits 1HSO to 4HSO may be activated. For example, when the first pull-up clock PU1 is activated and the second to fourth pull-up clocks PU2 to PU4 are deactivated, the first trimming circuit 1TC and the first high pulse output circuit 1HSO may be activated, and the remaining second to fourth trimming circuits 2TC to 4TC and second to fourth high pulse output circuits 2HSO to 4HSO may be deactivated.

The first pull-down pre-driver 81b may output first to fourth pull-down codes PDC<1> to PDC<4> by trimming the first to fourth pull-down clocks PD1 to PD4. The first pull-down main driver 82b may output a low pulse L having a ground voltage level in response to the first to fourth pull-down codes PDC<1> to PDC<4>.

The first pull-down pre-driver 81b may include first to fourth trimming circuits 1TC' to 4TC' outputting first to fourth pull-down codes PDC<1> to PDC<4> by trimming the first to fourth pull-down clocks PD1 to PD4, respectively. The first pull-down main driver 82b may include first to fourth low pulse output circuits 1LSO' to 4LSO' outputting the low pulse L in response to the first to fourth pull-down codes PDC<1> to PDC<4>. The first to fourth trimming circuits 1TC' to 4TC' may be configured identically to each other, and the first to fourth low pulse output circuits 1LSO' to 4LSO' may be configured identically to each other. The first trimming circuit 1TC' may output a pull-down main code PDMC and the first to third pull-down trimming codes 1PDTC to 3PDTC by trimming the first pull-down clock PD1, and the first low pulse output circuit 1LSO' may output the low pulse L in response to the pull-down main code PDMC and the first to third pull-down trimming codes 1PDTC to 3PDTC. The remaining second to fourth trimming circuits 2TC' to 4TC' may also output the second to fourth pull-down codes PDC<2> to PDC<4> including the pull-down main code PDMC and the first to third pull-down trimming codes 1PDTC to 3PDTC by trimming the second to fourth pull-down clocks PD2 to PD4, respectively. The second to fourth low pulse output circuits 2LSO' to 4LSO' may output the low pulse L in response to the second to fourth pull-down codes PDC<2> to PDC<4>, respectively.

All of the first to fourth pull-down clocks PD1 to PD4 may be activated or only some of the first to fourth pull-down clocks PD1 to PD4 may be activated according to the mode, and only circuits connected to an activated pull-down clock among the first to fourth trimming circuits 1TC' to 4TC' and the first to fourth low pulse output circuits 1LSO' to 4LSO' may be activated. For example, when the first pull-down clock PD1 is activated and the second to fourth pull-down clocks PD2 to PD4 are deactivated, the first trimming circuit 1TC' and the first low pulse output circuit 1LSO' may be activated, and the remaining second to fourth trimming circuits 2TC' to 4TC' and second to fourth low pulse output circuits 2LSO' to 4LSO' may be deactivated.

When the first pull-up main driver 82a outputs the high pulse H, an output node of the first pull-down main driver 82b may be floated, and when the first pull-down main driver 82b outputs the low pulse L, an output node of the first pull-up main driver 82a may be floated. Therefore, the first driver 250a may output the first data strobe clock DQS1.

Figure 9:
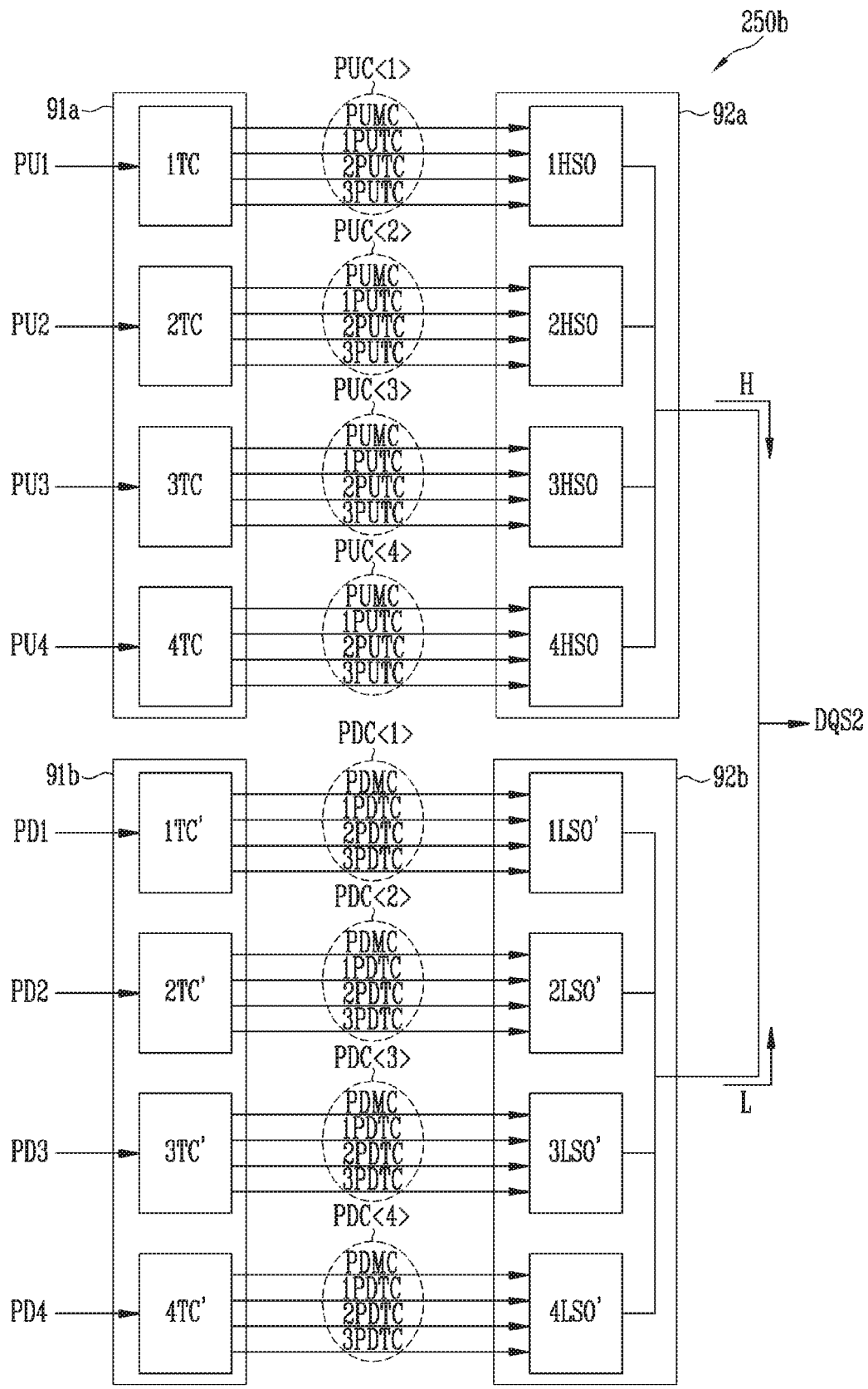
FIG. 9 is a diagram for describing a second driver according to an embodiment of the present disclosure.

FIG. 9 is a diagram for describing the second driver according to an embodiment of the present disclosure.

Referring to FIG. 9, the second driver 250b may output the second data strobe clock DQS2 in response to the first to fourth pull-up clocks PU1 to PU4 and the first to fourth pull-down clocks PD1 to PD4 output from the second mode selector 240b. The second driver 250b may include a second pull-up pre-driver 91a, a second pull-down pre-driver 91b, a second pull-up main driver 92a, and a second pull-down main driver 92b.

The second pull-up pre-driver 91a may output first to fourth pull-up codes PUC<1> to PUC<4> by trimming the first to fourth pull-up clocks PU1 to PU4. The second pull-up main driver 92a may output a high pulse H having a power voltage level in response to the first to fourth pull-up codes PUC<1> to PUC<4>.

The second pull-up pre-driver 91a may include first to fourth trimming circuits 1TC to 4TC outputting the first to fourth pull-up codes PUC<1> to PUC<4> by trimming the first to fourth pull-up clocks PU1 to PU4, respectively. The second pull-up main driver 92a may include first to fourth high pulse output circuits 1HSO to 4HSO outputting the high pulse H in response to the first to fourth pull-up codes PUC<1> to PUC<4>. The first to fourth trimming circuits 1TC to 4TC may be configured identically to each other, and the first to fourth high pulse output circuits 1HSO to 4HSO may be configured identically to each other. The first trimming circuit 1TC may output a pull-up main code PUMC and first to third pull-up trimming codes 1PUTC to 3PUTC by trimming trim the first pull-up clock PU1, and the first high pulse output circuit 1HSO may output the high pulse H in response to the pull-up main code PUMC and the first to third pull-up trimming codes 1PUTC to 3PUTC. The remaining second to fourth trimming circuits 2TC to 4TC also may output second to fourth pull-up codes PUC<2> to PUC<4> including the main code PUMC and the first to third pull-up trimming codes 1PUTC to 3PUTC by trimming the second to fourth pull-up clocks PU2 to PU4, respectively. The second to fourth high pulse output circuits 2HSO to 4HSO may output the high pulse H in response to the second to fourth pull-up codes PUC<2> to PUC<4>, respectively.

All of the first to fourth pull-up clocks PU1 to PU4 may be activated or only some of the first to fourth pull-up clocks PU1 to PU4 may be activated according to a mode, and only circuits connected to an activated pull-up clock among the first to fourth trimming circuits 1TC to 4TC and the first to fourth high pulse output circuits 1HSO to 4HSO may be activated. For example, when the first pull-up clock PU1 is activated and the second to fourth pull-up clocks PU2 to PU4 are deactivated, the first trimming circuit 1TC and the first high pulse output circuit 1HSO may be activated, and the remaining second to fourth trimming circuits 2TC to 4TC and second to fourth high pulse output circuits 2HSO to 4HSO may be deactivated.

The second pull-down pre-driver 91b may output first to fourth pull-down codes PDC<1> to PDC<4> by trimming the first to fourth pull-down clocks PD1 to PD4. The second pull-down main driver 92b may output a low pulse L having a ground voltage level in response to the first to fourth pull-down codes PDC<1> to PDC<4>.

The second pull-down pre-driver 91b may include first to fourth trimming circuits 1TC' to 4TC' outputting first to fourth pull-down codes PDC<1> to PDC<4> by trimming the first to fourth pull-down clocks PD1 to PD4, respectively. The second pull-down main driver 92b may include first to fourth low pulse output circuits 1LSO' to 4LSO' outputting the low pulse L in response to the first to fourth pull-down codes PDC<1> to PDC<4>. The first to fourth trimming circuits 1TC' to 4TC' may be configured identically to each other, and the first to fourth low pulse output circuits 1LSO' to 4LSO' may be configured identically to each other. The first trimming circuit 1TC' may output a pull-down main code PDMC and the first to third pull-down trimming codes 1PDTC to 3PDTC by trimming the first pull-down clock PD1, and the first low pulse output circuit 1LSO' may output the low pulse L in response to the pull-down main code PDMC and the first to third pull-down trimming codes 1PDTC to 3PDTC. The remaining second to fourth trimming circuits 2TC' to 4TC' may also output the second to fourth pull-down codes PDC<2> to PDC<4> including the pull-down main code PDMC and the first to third pull-down trimming codes 1PDTC to 3PDTC by trimming the second to fourth pull-down clocks PD2 to PD4, respectively. The second to fourth low pulse output circuits 2LSO' to 4LSO' may output the low pulse L in response to the second to fourth pull-down codes PDC<2> to PDC<4>, respectively.

All of the first to fourth pull-down clocks PD1 to PD4 may be activated or only some of the first to fourth pull-down clocks PD1 to PD4 may be activated according to the mode, and only circuits connected to an activated pull-down clock among the first to fourth trimming circuits 1TC' to 4TC' and the first to fourth low pulse output circuits 1LSO' to 4LSO' may be activated. For example, when the first pull-down clock PD1 is activated and the second to fourth pull-down clocks PD2 to PD4 are deactivated, the first trimming circuit 1TC' and the first low pulse output circuit 1LSO' may be activated, and the remaining second to fourth trimming circuits 2TC' to 4TC' and second to fourth low pulse output circuits 2LSO' to 4LSO' may be deactivated.

When the second pull-up main driver 92a outputs the high pulse H, an output node of the second pull-down main driver 92b may be floated, and when the second pull-down main driver 92b outputs the low pulse L, an output node of the second pull-up main driver 92a may be floated. Therefore, the second driver 250b may output the second data strobe clock DQS2.

Figure 10:
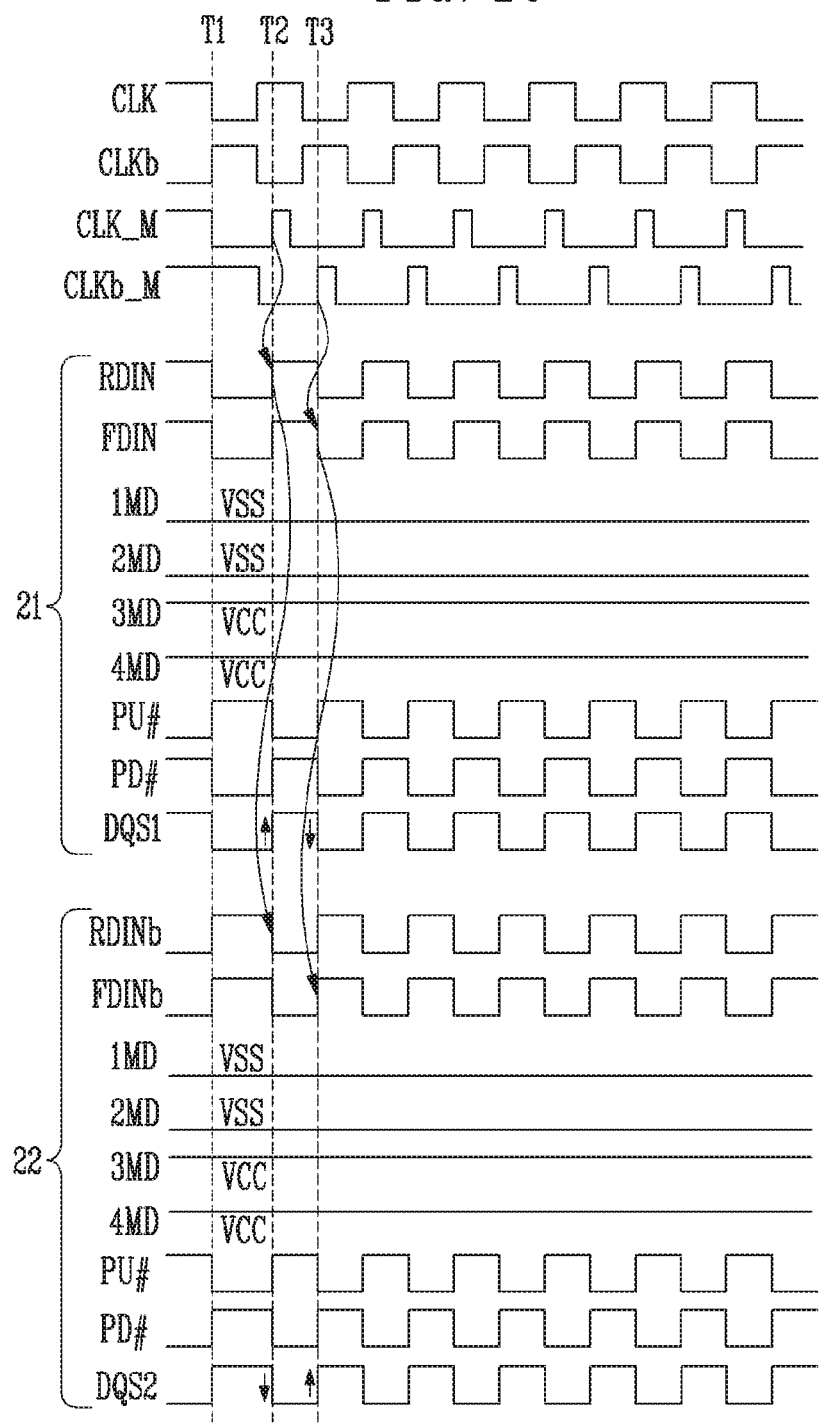
FIG. 10 is a diagram for describing an operation of the data strobe clock output circuit according to an embodiment of the present disclosure.

FIG. 10 is a diagram for describing an operation of the data strobe clock output circuit according to an embodiment of the present disclosure.

Referring to FIG. 10, the data strobe clock output circuit may output the first data strobe clock DQS1 and the second data strobe clock DQS2 of which the phases are opposite to each other, based on the clock CLK.

When a data strobe clock generation operation is started (T1), the clock modulator 210 of FIG. 3 may output the modulated clock CLK_M and the modulated inverted clock CLKb_M by modulating the pulse width of the clock CLK and the inverted clock CLKb. The high pulse of the modulated clock CLK_M is narrower than the high pulse of the clock CLK, and the low pulse of the modulated clock CLK_M is wider than the low pulse of the clock CLK. The high pulse of the modulated inverted clock CLKb_M is narrower than the high pulse of the inverted clock CLKb, and the low pulse of the modulated inverted clock CLKb_M is wider than the low pulse of the inverted clock CLKb.

The clocks output from the first output circuit 21 of FIG. 2 are described as follows.

The rising clock RDIN and the falling clock FDIN transit to high at a high edge of the modulated clock CLK_M and transit to low at a low edge of the modulated clock CLK_M.

Pull-up clocks PU # may be selectively output in response to the first to fourth mode signals 1MD to 4MD and the rising clock RDIN. Pull-down clocks PD # may be selectively output in response to the first to fourth mode signals 1MD to 4MD and the falling clock FDIN.

When the first and second mode signals 1MD and 2MD have a level of the ground voltage VSS and the third and fourth mode signals 3MD and 4MD have a level of the power voltage VCC, the third and fourth pull-up clocks PU3 and PU4 may be output in response to the third and fourth mode signals 3MD and 4MD having the level of the power voltage VCC, the first and second pull-up clocks PU1 and PU2 are not output in response to the first and second mode signals 1MD and 2MD having the level of the ground voltage VSS. For example, the third and fourth pull-up clocks PU3 and PU4 may be output as clocks having a phase opposite to that of the rising clock RDIN, and the first and second pull-up clocks PU1 and PU2 may be output as signals having a high level, not a clock.

That is, when the first and second mode signals 1MD and 2MD have the level of the ground voltage VSS and the third and fourth mode signals 3MD and 4MD have the level of the power voltage VCC, the first and second sub pull-up circuits 611 and 612 may be deactivated, and the third and fourth sub pull-up circuits 613 and 614 may be activated, among the first to fourth sub pull-up circuits 611 to 614 included in the pull-up circuit 610 of the first mode selector 240a of FIG. 6.

When the third and fourth sub pull-up circuits 613 and 614 included in the pull-up circuit 610 of the first mode selector 240a of FIG. 6 are activated, the third and fourth trimming circuits 3TC and 4TC included in the first pull-up pre-driver 81a of the first driver 250a of FIG. 8 may be activated and the third and fourth pull-up codes PUC<3> and PUC<4> of FIG. 8 may be output.

The third and fourth high pulse output circuits 3HSO and 4HSO of FIG. 8 may output the high pulse of the first data strobe clock DQS1 in response to the third and fourth pull-up codes PUC<3> and PUC<4.

The pull-down clocks PD # may be selectively output in response to the first to fourth mode signals 1MD to 4MD and the falling clock FDIN.

When the first and second mode signals 1MD and 2MD have the level of the ground voltage VSS and the third and fourth mode signals 3MD and 4MD have the level of the power voltage VCC, the third and fourth pull-down clocks PD3 and PD4 may be output in response to the third and fourth mode signals 3MD and 4MD having the level of the power voltage VCC, the first and second pull-down clocks PD1 and PD2 are not output in response to the first and second mode signals 1MD and 2MD having the level of the ground voltage VSS. For example, the third and fourth pull-down clocks PD3 and PD4 may be output as clocks having the same phase as the falling clock FDIN, and the first and second pull-down clocks PD1 and PD2 may be output as signals having a high level, not a clock.

That is, when the first and second mode signals 1MD and 2MD have the level of the ground voltage VSS and the third and fourth mode signals 3MD and 4MD have the level of the power voltage VCC, the first and second sub pull-down circuits 621 and 622 may be deactivated, and the third and fourth sub pull-down circuits 623 and 624 may be activated, among the first to fourth sub pull-down circuits 621 to 624 included in the pull-down circuit 620 of the first mode selector 240a of FIG. 6.

When the third and fourth sub pull-down circuits 623 and 624 included in the pull-down circuit 620 of the first mode selector 240a of FIG. 6 are activated, the third and fourth trimming circuits 3TC' and 4TC' of FIG. 8 included in the second pull-down pre-driver 81b of FIG. 8 of the first driver 250a of FIG. 8 may be activated and the third and fourth pull-down codes PDC<3> and PDC<4> of FIG. 8 may be output.

The third and fourth low pulse output circuits 3LSO' and 4LSO' of FIG. 8 may output the low pulse of the first data strobe clock DQS1 in response to the third and fourth pull-down codes PDC<3> and PDC<4>.

The second output circuit 22 of FIG. 2 may output the second data strobe clock DQS2 having the phase opposite to that of the first data strobe clock DQS1, using the rising inverted clock RDINb and the falling inverted clock FDINb in which the rising clock RDIN and the falling clock FDIN output from the first output circuit 21 are inverted.

The clocks output from the second output circuit 22 are described as follows.

The rising inverted clock RDINb has a phase inverted from that of the rising clock RDIN output from the first output circuit 21.

The pull-up clocks PU # may be selectively output in response to the first to fourth mode signals 1MD to 4MD and the rising inverted clock RDINb, and the pull-down clocks PD # may be selectively output in response to the first to fourth mode signals 1MD to 4MD and the falling inverted clock FDINb. The first to fourth mode signals 1MD to 4MD input to the second output circuit 22 are the same as the first to fourth mode signals 1MD to 4MD input to the first output circuit 21.

For example, since the first and second mode signals 1MD and 2MD have the level of the ground voltage VSS and the third and fourth mode signals 3MD and 4MD have the level of the power voltage VCC, the third and fourth pull-up clocks PU3 and PU4 may be output in response to the third and fourth mode signals 3MD and 4MD having the level of the power voltage VCC, the first and second pull-up clocks PU1 and PU2 are not output in response to the first and second mode signals 1MD and 2MD having the level of the ground voltage VSS. For example, the third and fourth pull-up clocks PU3 and PU4 may be output as clocks having a phase opposite to that of the rising inverted clock RDINb, and the first and second pull-up clocks PU1 and PU2 may be output as signals having a high level, not a clock.

That is, when the first and second mode signals 1MD and 2MD have the level of the ground voltage VSS and the third and fourth mode signals 3MD and 4MD have the level of the power voltage VCC, the first and second sub pull-up circuits 711 and 712 may be deactivated, and the third and fourth sub pull-up circuits 713 and 714 may be activated, among the first to fourth sub pull-up circuits 711 to 714 included in the pull-up circuit 710 of the second mode selector 240b of FIG. 7.

When the third and fourth sub pull-up circuits 713 and 714 included in the pull-up circuit 710 of the second mode selector 240b of FIG. 7 are activated, the third and fourth trimming circuits 3TC and 4TC of FIG. 9 included in the second pull-up pre-driver 91a of FIG. 9 of the second driver 250b of FIG. 9 may be activated and the third and fourth pull-up codes PUC<3> and PUC<4> of FIG. 9 may be output.

The third and fourth high pulse output circuits 3HSO and 4HSO of FIG. 9 may output the high pulse of the second data strobe clock DQS2 in response to the third and fourth pull-up codes PUC<3> and PUC<4>.

The pull-down clocks PD # may be selectively output in response to the first to fourth mode signals 1MD to 4MD and the falling clock FDIN.

When the first and second mode signals 1MD and 2MD have the level of the ground voltage VSS and the third and fourth mode signals 3MD and 4MD have the level of the power voltage VCC, the third and fourth pull-down clocks PD3 and PD4 may be output in response to the third and fourth mode signals 3MD and 4MD having the level of the power voltage VCC, the first and second pull-down clocks PD1 and PD2 are not output in response to the first and second mode signals 1MD and 2MD having the level of the ground voltage VSS. For example, the third and fourth pull-down clocks PD3 and PD4 may be output as clocks having the same phase as the falling clock FDIN, and the first and second pull-down clocks PD1 and PD2 may be output as signals having a high level, not a clock.

That is, when the first and second mode signals 1MD and 2MD have the level of the ground voltage VSS and the third and fourth mode signals 3MD and 4MD have the level of the power voltage VCC, the first and second sub pull-down circuits 721 and 722 may be deactivated, and the third and fourth sub pull-down circuits 723 and 724 may be activated, among the first to fourth sub pull-down circuits 721 to 724 included in the pull-down circuit 720 of the second mode selector 240b of FIG. 7.

When the third and fourth sub pull-down circuits 723 and 724 included in the pull-down circuit 720 of the second mode selector 240b of FIG. 7 are activated, the third and fourth trimming circuits 3TC' and 4TC' of FIG. 9 included in the second pull-down pre-driver 91b of FIG. 9 of the second driver 250b of FIG. 9 may be activated and the third and fourth pull-down codes PDC<3> and PDC<4> of FIG. 9 may be output.

The third and fourth low pulse output circuits 3LSO and 4LSO of FIG. 9 may output the low pulse of the second data strobe clock DQS2 in response to the third and fourth pull-down codes PDC<3> and PDC<4>.

Figure 11:
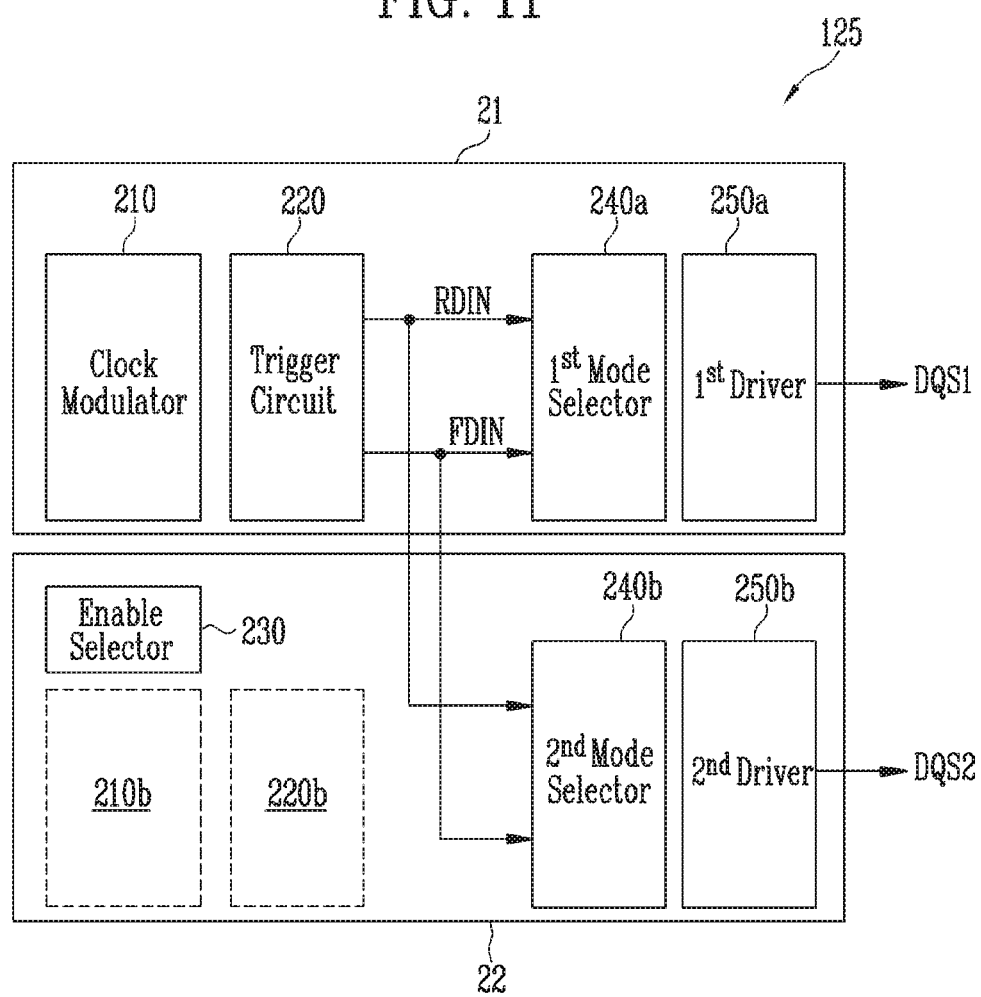
FIG. 11 is a diagram for comparing the data strobe clock output circuit according to an embodiment of the present disclosure with another circuit.

FIG. 11 is a diagram for comparing the data strobe clock output circuit according to an embodiment of the present disclosure with a another circuit.

Referring to FIG. 11, the data strobe clock output circuit 125 according to a present embodiment includes the first output circuit 21 outputting the first data strobe clock DQS1 and the second output circuit 22 outputting the second data strobe clock DQS2. The second output circuit 22 shares the rising clock RDIN and the falling clock FDIN generated by the first output circuit 21, and thus the second output circuit 22 does not include circuits 210b and 220b respectively corresponding to the clock modulator 210 and the trigger circuit 220 included in the first output circuit 21. Therefore, since a size of the second output circuit 22 is reduced, a size of the data strobe clock output circuit 125 may be reduced, and a size of the controller including the data strobe clock output circuit 125 may be reduced.

Figure 12:
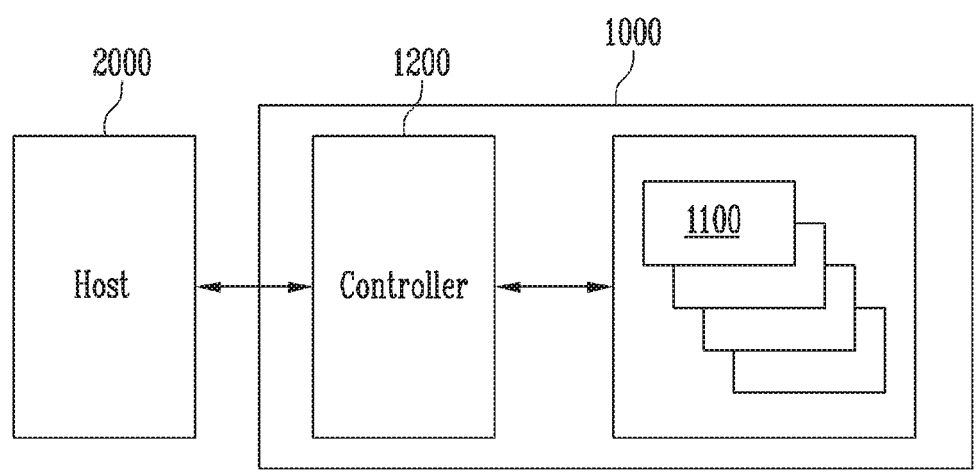
FIG. 12 is a diagram for describing a memory system including a controller of the present disclosure.

FIG. 12 is a diagram for describing a memory system including the controller of the present disclosure.

Referring to FIG. 12, the memory system 1000 may include the memory device 1100 in which data is stored, and the controller 1200 communicating between the memory device 1100 and the host 2000.

The memory system 1000 may include a plurality of memory devices 1100, and the memory devices 1100 may be connected to the controller 1200 through at least one channel. For example, a plurality of memory devices 1100 may be connected to one channel, and the plurality of memory devices 1100 may be connected to each channel even in a case where a plurality of channels are connected to the controller 1200.

The controller 1200 may communicate between the host 2000 and the memory device 1100, and may include the data strobe clock output circuit 125 as shown in FIG. 1. The controller 1200 may control the memory device 1100 according to a request of the host 2000 or may perform a background operation for performance improvement of the memory system 1000 even though there is no request from the host 2000. The host 2000 may generate requests for various operations and output the generated requests to the memory system 1000. For example, the requests may include a program request that may control a program operation, a read request that may control a read operation, an erase request that may control an erase operation, and the like.

The host 2000 may communicate with the memory system 1000 through various interfaces such as peripheral component interconnect express (PCIe), advanced technology attachment (ATA), serial ATA (SATA), parallel ATA (PATA), serial attached SCSI (SAS), non-volatile memory express (NVMe) a universal serial bus (USB), a multi-media card (MMC), an enhanced small device interface (ESDI), or integrated drive electronics (IDE).

Figure 13:
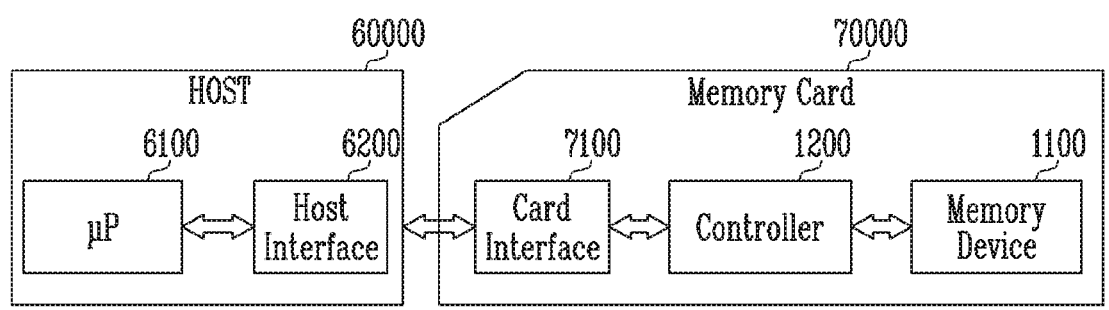
FIG. 13 is a diagram for describing another memory system including the controller of the present disclosure.

FIG. 13 is a diagram for describing another memory system including the controller of the present disclosure.

Referring to FIG. 13, the memory system 70000 may be implemented as a memory card or a smart card. The memory system 70000 may include the memory device 1100, the controller 1200, and a card interface 7100.

The controller 1200 may control data exchange between the memory device 1100 and the card interface 7100, and may include the data strobe clock output circuit 125 as shown in FIG. 1.

The card interface 7100 may be a secure digital (SD) card interface or a multi-media card (MMC) interface, but is not limited thereto.

The card interface 7100 may interface data exchange between a host 60000 and the controller 1200 according to a protocol of the host 60000. According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the controller 1200 under control of a microprocessor (μP) 6100.

What is claimed is:

1. A data strobe clock output circuit comprising:
a first output circuit configured to generate a rising clock and a falling clock in response to a clock and a first enable signal and output a first data strobe clock in response to the rising clock, the falling clock, and mode signals; and
a second output circuit configured to generate a rising inverted clock and a falling inverted clock by inverting the rising clock and the falling clock generated by the first output circuit, and output a second data strobe clock in response to the rising inverted clock, the falling inverted clock, a second enable signal, and the mode signals;
wherein the second output circuit comprises:
an enable selector configured to receive the second enable signal and output sub mode signals in response to the mode signals;
a second mode selector configured to invert the rising clock to generate the rising inverted clock, invert the falling clock to generate the falling inverted clock, and output pull-up clocks and pull-down clocks in response to the rising inverted clock, the falling inverted clock, and the sub mode signals; and
a second driver configured to output the second data strobe clock in response to one or more of the pull-up clocks and one or more of the pull-down clocks.

2. The data strobe clock output circuit of claim 1, wherein the first output circuit comprises:
a clock modulator configured to output a modulated clock and a modulated inverted clock in response to the clock, an inverted clock having a phase opposite to a phase of the clock, and the first enable signal;
a trigger circuit configured to output the rising clock and the falling clock in response to the clock, the modulated clock, and the modulated inverted clock;
a first mode selector configured to output pull-up clocks and pull-down clocks in response to the rising clock, the falling clock, and the mode signals; and
a first driver configured to output the first data strobe clock in response to one or more of the pull-up clocks and one or more of the pull-down clocks.

3. The data strobe clock output circuit of claim 2, wherein the clock modulator comprises:
a first modulator activated in response to the first enable signal and outputting the modulated clock by modulating a width of the clock; and
a second modulator activated in response to the first enable signal and outputting the modulated inverted clock by modulating a width of the inverted clock.

4. The data strobe clock output circuit of claim 3, wherein the first modulator is configured to output the modulated clock in which a width of a high pulse is narrower than a high pulse of the clock and a width of a low pulse is wider than a low pulse of the clock, and
the second modulator is configured to output the modulated inverted clock in which a width of a high pulse is narrower than a high pulse of the inverted clock and a width of a low pulse is wider than a low pulse of the inverted clock.

5. The data strobe clock output circuit of claim 2, wherein the trigger circuit comprises:
a rising circuit configured to output the rising clock in response to the clock and the modulated clock; and
a falling circuit configured to output the falling clock in response to the clock and the modulated inverted clock.

6. The data strobe clock output circuit of claim 5, wherein the rising circuit comprises:
a rising trigger circuit configured to output a first trigger clock in response to the clock and the modulated clock; and
a rising buffer configured to output the rising clock in response to the first trigger clock.

7. The data strobe clock output circuit of claim 5, wherein the falling circuit comprises:
a falling trigger circuit configured to output a second trigger clock in response to the clock and the modulated inverted clock; and
a falling buffer configured to output the falling clock in response to the second trigger clock.

8. The data strobe clock output circuit of claim 2, wherein the first mode selector comprises:
a pull-up circuit configured to receive the rising clock and selectively output the pull-up clocks in response to the mode signals; and
a pull-down circuit configured to receive the falling clock and selectively output the pull-down clocks in response to the mode signals.

9. The data strobe clock output circuit of claim 2, wherein the first driver comprises:
a first pull-up pre-driver configured to selectively output pull-up codes including a pull-up main code and pull-up trimming codes by trimming one or more of the pull-up clocks;
a first pull-up main driver configured to output a high pulse of the first data strobe clock in response to one or more of the pull-up codes;
a first pull-down pre-driver configured to selectively output pull-down codes including a pull-down main code and pull-down trimming codes by trimming one or more of the pull-down clocks; and
a first pull-down main driver configured to output a low pulse of the first data strobe clock in response to one or more of the pull-down codes.

10. The data strobe clock output circuit of claim 1, wherein the second output circuit is activated when the second enable signal input to the enable selector is at a high level to output the second data strobe clock, and deactivated when the second enable signal is at a low level.

11. The data strobe clock output circuit of claim 1, wherein the second mode selector comprises:
a pull-up circuit configured to receive the rising inverted clock and selectively output the pull-up clocks in response to the sub mode signals; and
a pull-down circuit configured to receive the falling inverted clock and selectively output the pull-down clocks in response to the sub mode signals.

12. The data strobe clock output circuit of claim 1, wherein the second driver comprises:

a second pull-up pre-driver configured to selectively output pull-up codes including a pull-up main code and pull-up trimming codes by trimming one or more of the pull-up clocks;

a second pull-up main driver configured to output a high pulse of the second data strobe clock in response to one or more of the pull-up codes;

a second pull-down pre-driver configured to selectively output pull-down codes including a pull-down main code and pull-down trimming codes by trimming one or more of the pull-down clocks; and a second pull-down main driver configured to output a low pulse of the second data strobe clock in response to one or more of the pull-down codes.

13. A data strobe clock output circuit comprising:

a clock modulator configured to output a modulated clock and a modulated inverted clock in response to a clock, an inverted clock, and a first enable signal;

a trigger circuit configured to output a rising clock and a falling clock in response to the clock, the modulated clock, and the modulated inverted clock;

an enable selector configured to output sub mode signals in response to mode signals and a second enable signal;

a first mode selector configured to output pull-up clocks and pull-down clocks in response to the rising clock, the falling clock, and the mode signals;

a first driver configured to output a first data strobe clock in response to one or more of the pull-up clocks and one or more of the pull-down clocks;

a second mode selector configured to invert the rising clock to generate a rising inverted clock, invert the falling clock to generate a falling inverted clock, and output pull-up clocks and pull-down clocks in response to the rising inverted clock, the falling inverted clock, and the sub mode signals; and a second driver configured to output a second data strobe clock in response to one or more of the pull-up clocks and one or more of the pull-down clocks.

14. The data strobe clock output circuit of claim 13, wherein the clock modulator, the trigger circuit, the first mode selector and the first driver are configured to be activated in response to the first enable signal, and the second mode selector and the second driver are configured to be activated in response to the second enable signal.

15. The data strobe clock output circuit of claim 13, wherein the clock modulator comprises:

a first modulator configured to output the modulated clock in response to the first enable signal and the clock; and a second modulator configured to output the modulated inverted clock in response to the first enable signal and the inverted clock.

16. The data strobe clock output circuit of claim 13, wherein the trigger circuit comprises:

a rising circuit configured to output the rising clock in response to the clock and the modulated clock; and a falling circuit configured to output the falling clock in response to the clock and the modulated inverted clock.

17. The data strobe clock output circuit of claim 13, wherein the first mode selector comprises:

a pull-up circuit configured to receive the rising clock and selectively output the pull-up clocks in response to the mode signals; and a pull-down circuit configured to receive the falling clock and selectively output the pull-down clocks in response to the mode signals.

18. The data strobe clock output circuit of claim 13, wherein the first driver comprises:

a first pull-up pre-driver configured to selectively output pull-up codes including a pull-up main code and pull-up trimming codes by trimming one or more of the pull-up clocks;

a first pull-up main driver configured to output a high pulse of the first data strobe clock in response to one or more of the pull-up codes;

a first pull-down pre-driver configured to selectively output pull-down codes including a pull-down main code and pull-down trimming codes by trimming one or more of the pull-down clocks; and a first pull-down main driver configured to output a low pulse of the first data strobe clock in response to one or more of the pull-down codes.

19. The data strobe clock output circuit of claim 13, wherein the second mode selector comprises:

a pull-up circuit configured to receive the rising inverted clock and selectively output the pull-up clocks in response to the sub mode signals; and a pull-down circuit configured to receive the falling inverted clock and selectively output the pull-down clocks in response to the sub mode signals.

20. The data strobe clock output circuit of claim 13, wherein the second driver comprises:

a second pull-up pre-driver configured to selectively output pull-up codes including a pull-up main code and pull-up trimming codes by trimming one or more of the pull-up clocks;

a second pull-up main driver configured to output a high pulse of the second data strobe clock in response to one or more of the pull-up codes;

a second pull-down pre-driver configured to selectively output pull-down codes including a pull-down main code and pull-down trimming codes by trimming one or more of the pull-down clocks; and a second pull-down main driver configured to output a low pulse of the second data strobe clock in response to one or more of the pull-down codes.

* * * * *